(12) United States Patent
Van Campenhout

(10) Patent No.: US 6,256,206 B1
(45) Date of Patent: Jul. 3, 2001

(54) ELECTRONIC CIRCUIT FOR AN ACTIVE IMPLANTABLE MEDICAL DEVICE AND METHOD OF MANUFACTURE

(75) Inventor: Yves Van Campenhout, Sanit George (FR)

(73) Assignee: Ela Medical S.A., Montrouge (FR)

( * ) Notice: Subject to any disclaimer, the term of this patent is extended or adjusted under 35 U.S.C. 154(b) by 0 days.

(21) Appl. No.: 09/210,074

(22) Filed: Dec. 11, 1998

(30) Foreign Application Priority Data

Dec. 12, 1997 (FR) ................................................. 97 15800

(51) Int. Cl.$^7$ ....................................................... H05K 1/11
(52) U.S. Cl. ......................... 361/760; 361/767; 361/772; 361/807; 174/260; 174/138 G
(58) Field of Search ..................... 361/748, 760, 361/761, 764, 767, 772, 782, 783, 803, 807–812; 257/678, 676, 687, 690, 723; 174/260, 138 R, 138 G; 29/592.1, 830, 840

(56) References Cited

U.S. PATENT DOCUMENTS

| | | | |
|---|---|---|---|
| 5,151,769 | * | 9/1992 | Immorlica, Jr. et al. ............ 257/348 |
| 5,255,431 | * | 10/1993 | Burdick ................................. 29/840 |
| 5,345,205 | | 9/1994 | Kornrumpf ........................ 361/749 X |
| 5,359,496 | * | 10/1994 | Kornrumpf et al. ................. 361/795 |
| 5,434,751 | | 7/1995 | Cole, Jr. et al. ...................... 361/792 |
| 5,745,984 | * | 5/1998 | Cole, Jr. et al. ........................ 29/834 |
| 5,801,438 | * | 9/1998 | Shirakawa et al. .................. 257/685 |
| 5,866,952 | * | 2/1999 | Wojnarowski et al. ............... 257/788 |

FOREIGN PATENT DOCUMENTS

| | | |
|---|---|---|
| 3925604 | 2/1991 | (DE). |
| 0384704 | 8/1990 | (EP). |
| 0450948 | 10/1991 | (EP). |
| 0456196 | 1/1992 | (EP). |
| 2599893 | 12/1987 | (FR). |
| WO 93/24956 | 12/1993 | (WO). |

OTHER PUBLICATIONS

Fillion, R.A. et al.: "Non–Digital Extensions of an Embedded Chip MCM Technology", *International Journal of Microcircuits and Electronic Packaging*, vol. 17, No. 4, Oct. 1, 1994, pp. 392–399.

Gdula, M. et al, "A High–Speed, High–Density Multiprocessing Module Made With the General Electric High–Density Interconnect Technology" *Digital Signal Processing*, vol. 2, No. 4, Oct. 1, 1992, pp. 247–251.

* cited by examiner

Primary Examiner—Jayprakash N. Gandhi
(74) Attorney, Agent, or Firm—Orrick, Herrington & Sutcliffe LLP

(57) ABSTRACT

An electronic circuit, particularly for an active implantable medical device such as a cardiac pacemaker or a defibrillator, and a process of realization (manufacture/assembly). This electronic circuit includes at least one chip (12), as well as other associated electronic components (18), placed on a substrate (10). The chip is a bare, exposed chip, that is not one embedded in a case or encapsulated, having on its face electrical contact pads turned to the exterior, such that the chip is buried in the thickness of the substrate, preferably near or at the bottom of a cavity (30). The cavity is filled with an isolating resin (38), up to the surface of the substrate and covering the chip, except for connection threads (34,36) connected to interconnection conductors (24, 26, 28) of the substrate. It is thus possible to place at least some supplementary components superimposed above the chip and, further, to foresee above the chip a plurality of supplementary layers of interconnections. The result is a more compact, space efficient electrical circuit.

20 Claims, 3 Drawing Sheets

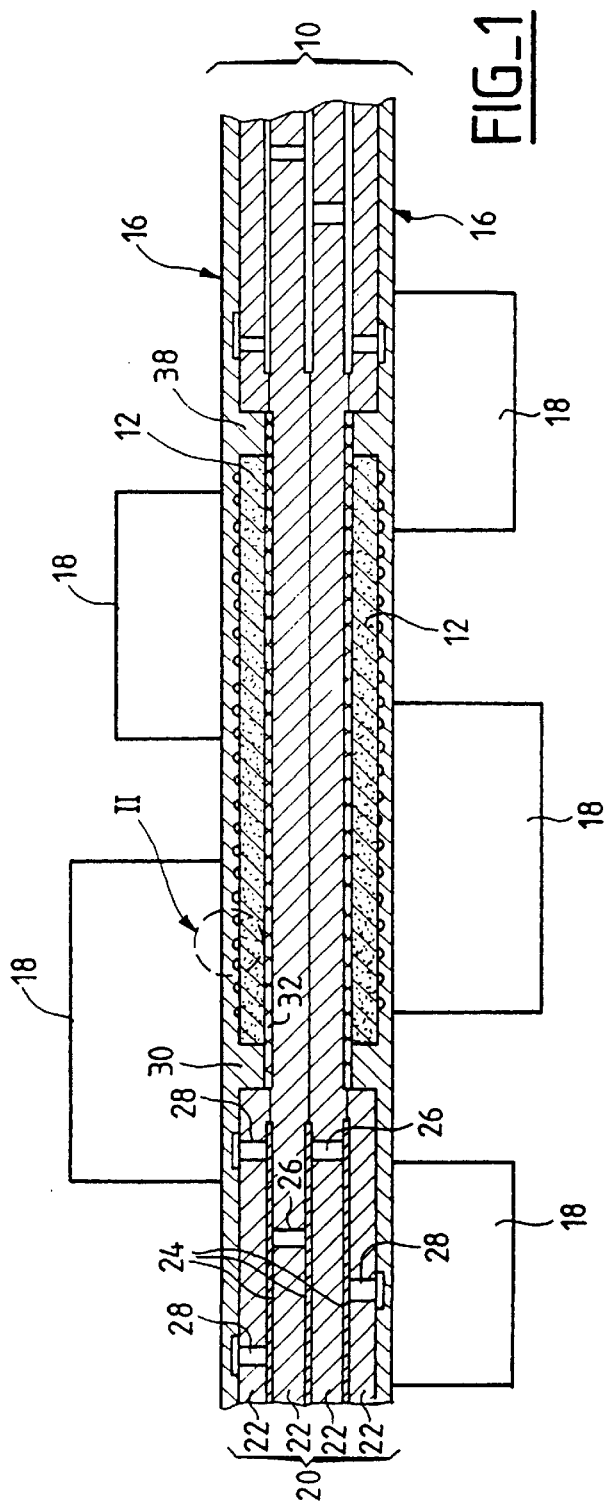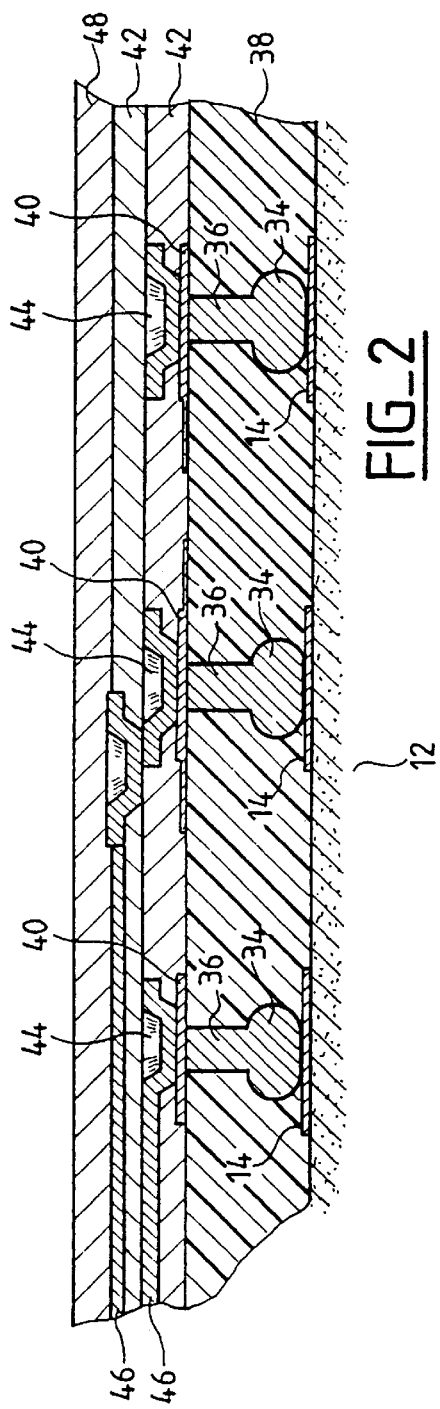

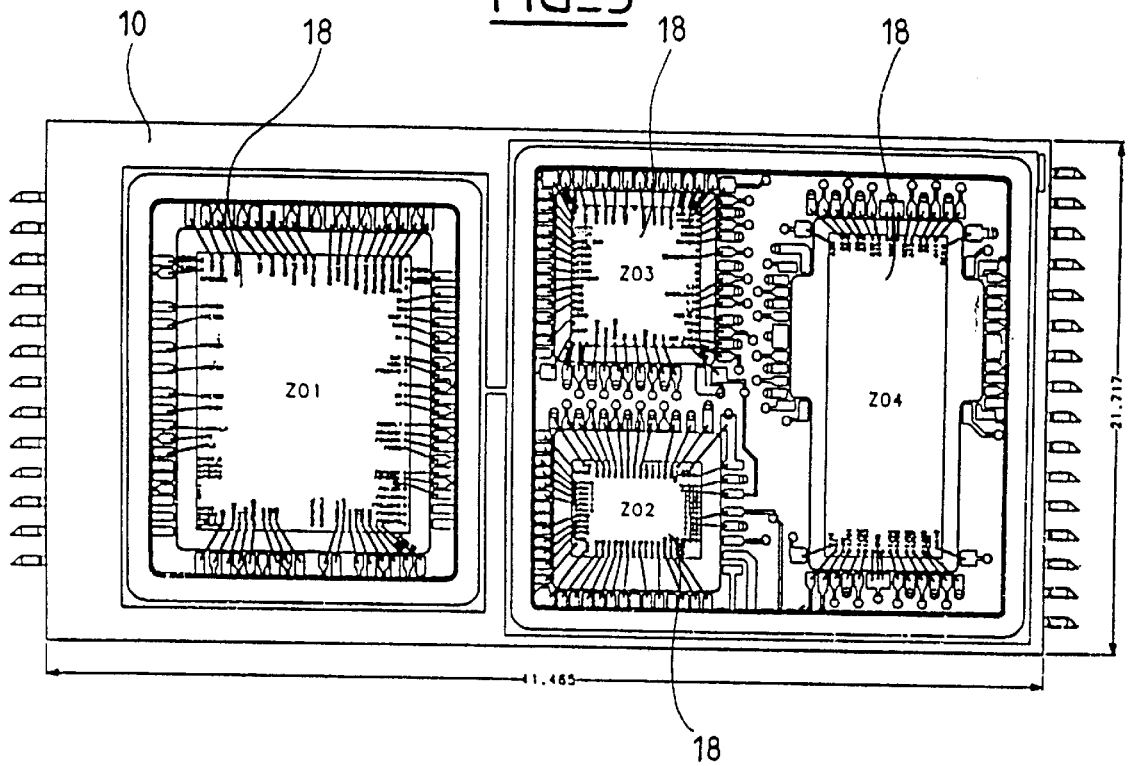
FIG_3
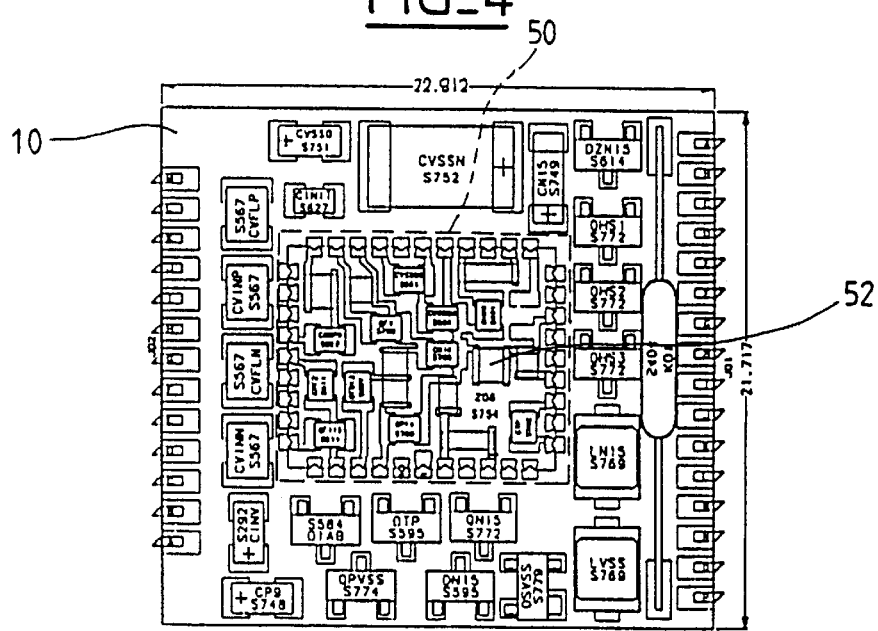
FIG_4

ELECTRONIC CIRCUIT FOR AN ACTIVE IMPLANTABLE MEDICAL DEVICE AND METHOD OF MANUFACTURE

FIELD OF THE INVENTION

The present invention concerns electronic circuit technology, more particularly electronic circuits for active implantable medical devices such as cardiac pacemakers and cardiac defibrillators.

BACKGROUND OF THE INVENTION

In these areas, the miniaturization of circuits is an essential parameter. One is often confronted with the difficulty of compromising between, on the one hand, an increase in the number of circuits and the electronic component size to have devices integrating a large number of functions, and, on the other hand, an increase in the miniaturization of the circuit, in a manner that does not encroach on the necessary volume for the battery of the power supply.

Until now, these electronic circuits have been habitually realized on a double face (two sided) substrate supporting, on one side, integrated circuits incorporating the various packaged integrated circuit chips and, on the other side, discrete components, including passive devices, such as capacitors, resistors, etc., and active devices such as diodes, etc.

OBJECTS AND SUMMARY OF THE INVENTION

It is an object of the present invention to propose a new technology for implementing an electronic circuit to obtain a large reduction in surface area and/or volume requirements, so as to reduce the dimensions of the electronic circuit by a very large proportion.

It is another object of the invention to rationalize a process of circuit manufacture, by allowing notably, a chip placement direct on the substrate, these chips being directly obtained after slicing from a semiconductor wafer, without additional processing or encapsulation (packaging).

Another object of the invention is to increase the integration density of discrete components and increase the routing density of the various electrical interconnections (that is, of the electrical connections from the chip to outside of the micro-circuit), and allow the utilization of the surface area formerly occupied by chips for the addition of supplementary interconnection layers and/or additional components.

Broadly, one aspect of the invention concerns a process for the placement of a micro-circuit chip on a substrate destined to receive this chip, as well as other associated electronic components, to form an electronic circuit. In one embodiment, this process is characterized by the following steps:

a) obtaining a single bare chip carrying on one of its faces at least one electrical contact pad;

b) obtaining a substrate comprising a surface layer, a cavity having a bottom, a depth and an area dimension greater than the corresponding height (thickness) and area dimensions of the chip;

c) installing the chip at or near the bottom of the substrate cavity with at least one contact pad facing or being turned to the exterior;

d) placing on the chip contact pad(s) an electrical connector(s)(so-called electrical connector thread(s)) which are disposed to emerge above the surface level of the substrate;

e) filling the cavity with an isolating resin up to the surface of the substrate, covering the chip and leaving the electrical connection thread(s) exposed;

f) forming an electrical connection between the exposed connection thread(s) and a interconnection layers of the substrate; and g) placing on the substrate at least one supplementary associated electronic component.

Thus, the electronic circuit is constructed of one or more integrated circuit chips electrically connected to one another and to discrete components using metalization layers and connection threads in the substrate.

According to various advantageous embodiments of the invention, at least one of the supplementary components of step g) is placed above (that is, superimposed over) the buried chip.

Further, in one embodiment, step c) may advantageously comprise bonding (e.g., by glue, paste or otherwise) the chip to the bottom of the cavity, preferably by means of a paste film with a controlled thickness.

In addition, step f) may comprise forming above the chip a plurality of supplementary interconnection layers.

In one embodiment, steps b) to g) are accomplished collectively on a single substrate "plate" supporting a plurality of electronic circuits, and, when completed, are then followed by a step of cutting the substrate to form individual electronic circuits, each in accordance with the present invention.

Another aspect of the invention is directed to a new industrial product, such as an electronic circuit comprising at least one chip, as well as other associated electronic components, placed on a substrate, in which the chip is a bare chip, that is not embedded in a case and not encapsulated, and has on its face, turned to the exterior, electrical contact pads. The chip is buried in the thickness of the substrate, at the bottom of a cavity. The cavity is filled with an isolating resin to the surface level of the substrate, covering the chip except for the connection threads. The connection threads form a connection between the chip contact pads and a conductive interconnection layer of the substrate.

BRIEF DESCRIPTION OF THE DRAWINGS

Other characteristics, features and advantages of the present invention will appear to the person of ordinary skill in the art in view of the following discussion of a detailed implementation of a preferred embodiment of the present invention, made with reference to the drawings annexed, in which like reference numbers refer to like elements, and in which:

FIG. 1 is a partial cross sectional view of a double faced circuit realized according to the present invention;

FIG. 2 is an enlarged view of the indicated detail area II of FIG. 1;

FIGS. 3 and 4 show, using the same scale for purposes of comparison, the same circuit realized with the technology of the prior art and the present invention, respectively.

DETAILED DESCRIPTION OF THE DRAWINGS

Figure 5:
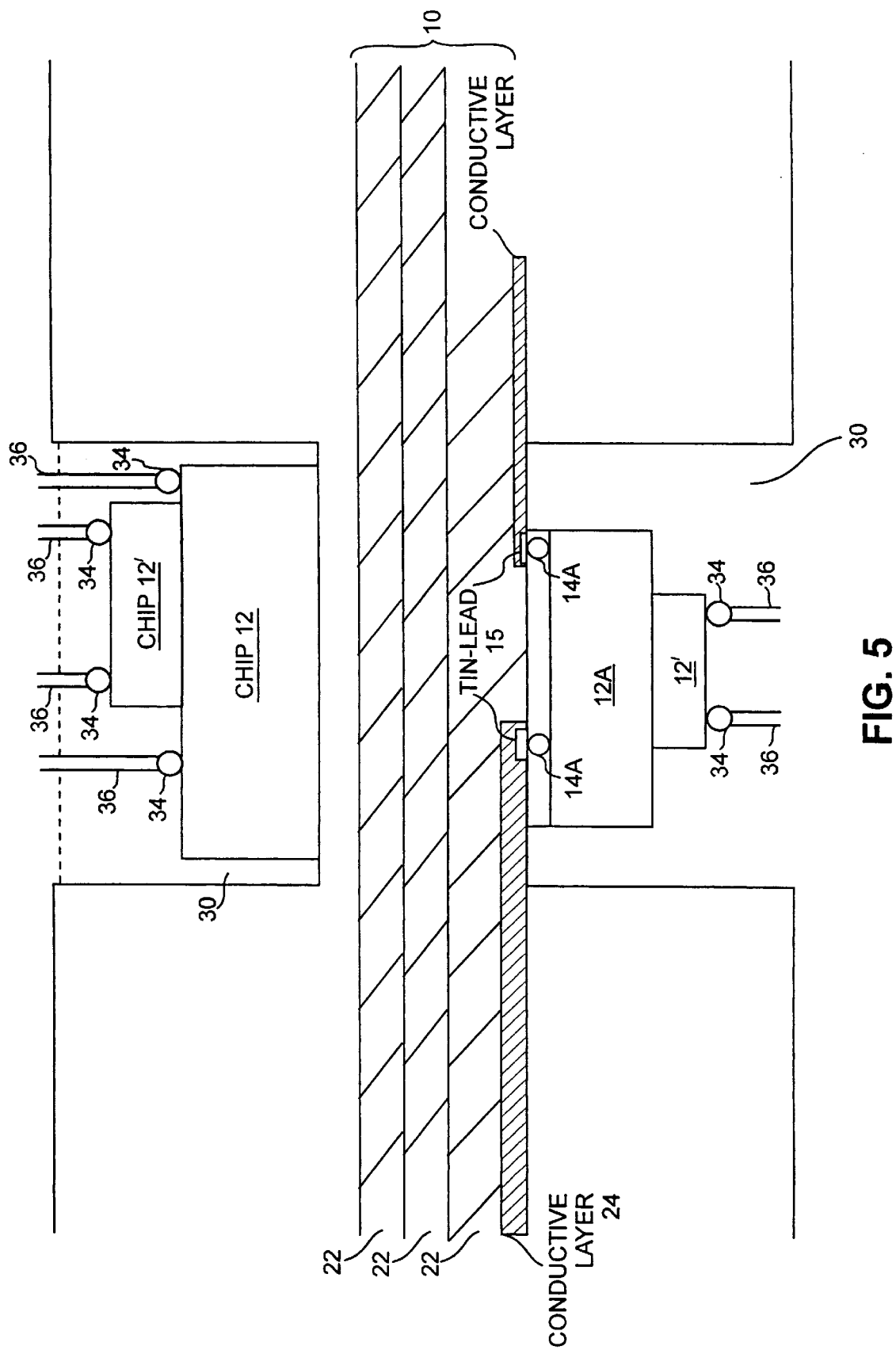
FIG. 5 is a side cross sectional view of alternate embodiments of a circuit in accordance with the present invention.

Referring to FIG. 1, the reference number 10 designates in a general manner an electronic circuit realized according to teaching of the invention. In this example, the circuit is a double face circuit, comprising on each of its faces, one or more integrated circuit chips 12, as well as various discrete components 18 placed (or mounted) on the surfaces 16. The discrete components 18 may be active or passive components, including both, for example CMS(Component Mounted on Surface) components. CMS is also known as Surface Mounted Components ("SMC") or Surface Mounted Technology ("SMT").

In a characteristic manner of the invention, chips 12 are bare chips. That is to say that they are sections directly stemming from a processed silicon wafer that has been cut into individual components, without supplementary processing, for example, neither embedded in nor coated with an encapsulating material or a case.

Chips 12 have on their surface one or more contact slots or pads 14 (visible on the detail of FIG. 2), which extend above the surface of chip 12. The manner in which pads 14 are connected to the exterior is discussed below in more detail.

The circuit 10 is realized (formed) on a substrate 20 that, in this example, is a multilayer substrate. It incorporates a plurality of isolating layers 22 supporting the conductive metalization layers 24. The metalization layers 24 are connected to each other by the internal conducting paths 26, and to the metalization layer on the surface by the external conductive paths 28. The substrate 20 is a substrate of the known type, generally made of glass epoxy, polyamide or the equivalent, and patterned copper or nickel metalization layers.

In an equally characteristic manner of the invention, substrate 20 comprises (in this example, on each of its faces) one or more cavities 30 whose dimensions, in surface area and in depth (thickness), are at least slightly greater than those of the chips 12 that the cavities 30 are destined to receive. The cavities 30 can be formed by the removal of material, for example by machining or etching of the multilayer substrate 20 after it is formed, or they can be formed in the appropriate layers by forming apertures in each of the individual layers as each layer is constructed, such that the different layers are superimposed with the apertures in alignment to form substrate 20 having cavities 30 on one or both sides of substrate 20.

The chip 12 is installed proximate to the bottom of the cavity 30, preferably at or near the bottom, more preferably with a thickness 32 of a paste (for example, a paste with framework) interposed between chip 12 and cavity 30 bottom. The frame should be understood to mean fibers of a calibrated nature so that when the chip is pressed against the paste, it will calibrate the height of the chip from the bottom of the cavity 30. The thickness of paste 32 provides for controlling the vertical position of the chip 12 in the cavity 30.

Once pasted to the bottom of the cavity 30, the chip 12 then receives on each of its contact pads 14 (or at least on those contact pads to be connected to the circuit) a series of electrical connections, for example, in the form of a sphere 34 having an extended vertical tail 36, collectively known as connector "threads". This initial contact formation may be realized by a conventional technique described in the international patent application WO-A-93/24956, which is commonly assigned to the assignee of this invention, and to which one will be able to refer for further details on the formation of electrical connection threads. Other suitable electrical connectors could be used.

The cavity 30 is next filled with a resin 38, in a quantity sufficient to completely bury the chip 12, with the exception of the end of vertical tails 36 of the electrical connection threads in contact with contact pads 14.

The material of the resin 38 is preferably a material such as a polyamide, a polyphenylquinoxalin, a polysiloxane, an epoxy resin or an equivalent material. Its coefficient of expansion is desirously chosen to be effectively the same as that of the substrate (for example, 19 ppm for a glass epoxy substrate), and it is flowed and hardened (cured) in situ, for example, by exposure to UV radiation or elevated temperature.

After hardening of the resin, the substrate 20 provided with buried chips 12 is submitted to a polishing or rectification operation in a manner to adjust the state of its surface to a flat state and to cut or trim vertical tails 36 to be flush with the surface obtained. Thus, the surface is prepared for metalization.

The next step is to deposit a metallization layer (for example, of nickel), that is or can be engraved or etched to form connection traces or pads 40 on the appropriate ones of the exposed tails 36, again in the manner taught by the aforementioned WO-A-93/24956.

The obtained circuit can eventually receive, particularly above the buried chips, supplementary interconnection layers, realized according to the known technique of forming "micro-paths". This technique provides for depositing layers 42 of isolating material that are etched to form contacts 44 passing through the thickness of the layer and connected to metallic conductors 46. One can thus superpose several such layers to increase the routing density and number of the interconnections to and between the chips and the circuit.

The resulting assembly then receives a final layer 48 that will be the surface layer of the substrate, and on which will be placed discrete components 18, generally CMS components.

Advantageously, the various steps that are discussed in the foregoing are performed on a substrate of large dimension, corresponding to a plurality of collectively formed individual circuits that will be later separated by cutting the plate into the individual circuits.

FIG. 3 is a plan view of one of the faces of a circuit 10 realized according to the teaching of the prior art. It concerns a double face circuit, where one of the faces bears integrated circuits in the form of components embedded in an encapsulation material or case 18 (of which four such circuits are shown in the illustrated example) and the other face (not visible in FIG. 3) bears the various discrete components. The particular type and arrangement of such discrete components is not critical to the invention. The surface area of a such circuit is on the order of 900 mm$^2$ and is shown having one side dimension that is 21.717 mm and the other side dimension of 41.465 mm.

Referring to FIG. 4, by way of comparison, the same circuit is shown realized according to teaching of the present invention. It also concerns a double face circuit, but the four integrated circuit chips shown in FIG. 3 are buried in the two sides of the circuit 10 of FIG. 4, and the discrete components are simply placed on the two sides of the circuit 10. The visible face of the circuit shown in FIG. 4 bears the chip that was that of the integrated circuit Z01 on the left of FIG. 3, but buried in the thickness of the substrate 20 and without packaging as indicated by the phantom (dashed line) contour 50, over which discrete components, such as component 52, are placed in superposition. The other face of the circuit 10 bears the three other chips, as well as other discrete components placed over the buried chips (not shown). This circuit has side dimensions of 21.717 mm by 72.812 mm placed over the buried chips.

Thanks to the technology implemented according to the present invention, it is possible to reduce the surface area of the substrate from 900 mm² according to the prior art to 495 mm² according to the invention, a gain of 45%, using the same number of components, the same chips, and therefore exactly the same functionality as the circuit of the prior art.

One will note that, in addition to the gain in surface area (that is, the reduction in size of the circuit also known as a "footprint"), the advances of the present invention obtain a gain in thickness on the order of 30%. This results from eliminating the packaging cases and materials for the integrated circuits in the incorporation of the chips in cavities in the thickness of the substrate. Thus, the total gain in volume, as compared to the prior art circuit, can reach 60% or more.

Referring to FIG. 5, an alternate embodiment of the present invention is shown in which more than one chip 12 is placed in the same cavity 30. For example, two chips 12 and 12' can be stacked one on top of the other with suitable thread connective elements 34 and 36 forming a conductive path from the contact pads 14 of chips 12 and 12' to the surface of substrate 20. Thus, by stacking chips that are progressively smaller or otherwise configured so that the desired contact pads 14 can be electrically connected to the surface, for example, a "wedding cake" stack, an even greater gain in surface area reduction can be obtained relative to the prior art. Thus, it may be possible to reduce the surface area while increasing (or the case may be) the thickness of the substrate 20 to obtain over all a greater reduction in volume.

Also referring to FIG. 5, yet another alternative embodiment provides for placing a chip 12 in cavity 30 in an inverted orientation, e.g., chip 12A, so that contact pads 14A may be oriented towards the center of substrate 20, rather than the surface. The contact pads 14A of chips 12A can be connected to a conductive layer 24 by a conductive glue (paste) (not shown) or using a flip chip solder bump, or by a known technique, for example, by laying a marble, bead or ball of tin-lead 15 in an appropriate location and forcing the chip contact pad 14A into contact therewith to form a reliable electrical connection. An adhesive, pressure or temperature can be used to enhance the reliability of the connection. The second chip 12' then can be placed over chip 12 and its electrical connection to the surface made as previously discussed. Subsequent encapsulation then keeps the chips in place.

It also should be understood that alternatively, chips 12A can be used which have contact pads 14A. In addition it should be understood that more than two chips can be placed in a given cavity, such as the chips 12 and 12' or 12A, 12, and 12' or in various combinations. For example, the chips need not be directly superimposed, such that two chips could be laid at the cavity bottom and one larger (or a number of smaller chips) stacked over those two chips at the bottom. Further, mini circuit board substrates can be interposed between stacked chips (or layers of chips) with some or all of the chips electrically connected thereto such that these interior circuit boards can have thereon patterned electrical connection traces and pads, including, for example, pads at the periphery which in turn can be connected to the surface of substrate 20 by connection threads (34 and 36) in the same manner as chips 12, 12A and 12' as shown in the drawings. Use of multiple chips and interior circuit boards is limited in that the density remains subject to the heat capacity limitations of the chips, resin and substrate.

One advantage of these alternatives is that it further minimizes the layout and positioning of multiple chips on a substrate surface area where lithographic technology is employed. In this regard, the present invention also can reduce the required tolerances for positioning the first chip 12 in relation to the last chip 12'.

One skilled in the art will appreciate that the present invention can be practiced by other than the specific embodiments and variations thereof disclosed, which are presented for purposes of illustration and not of limitation.

I claim:

1. An electronic circuit for an active implantable medical device, such as a cardiac pacemaker or defibrillator, comprising:

at least one chip (12) and at least one other associated electronic component (18) placed on a substrate (10), wherein said at least one chip is a bare chip, not embedded in an encapsulation, having an electrical contact pad on at least one surface, and wherein the chip surface having said contact pad is turned toward the exterior, and wherein the substrate comprises a thickness and a cavity (30) having a bottom, wherein the chip is located proximate to the bottom of the substrate cavity;

an electrical connection having one end connected to the chip contact pad and the other end extending to a surface of the substrate; and an isolating resin (38) filling the cavity to the surface of the substrate such that the isolating resin covers the chip and not the end of the electrical connection, wherein the electrical connection is to be connected to electrical interconnections (24, 26, 28) of the substrate.

2. The circuit of claim 1, in which at least one of the associated electronic components is placed in superposition above the at least one chip.

3. The circuit of claim 2 wherein the electrical connection further comprises an electrical connection thread.

4. The circuit of claim 1, further comprising a plurality of supplementary interconnection layers (42, 44, 46) placed above the chip.

5. The circuit of claim 1 wherein said at least one chip further comprises a first chip having a first area and a second chip having a second area, said first chip being at said cavity bottom, each of said first and second chips having at least one contact pad turned toward said surface and said contact pads of the first and second chips having electrical connections extending to said surface.

6. The circuit of claim 5 wherein the cavity further comprises a depth sufficient to receive the first and second chips in said cavity and below the surface.

7. The circuit of claim 5 wherein at least one of the first and second chips comprises more than one chip, said more than one chip being superposed at least partially relative to said other of the first and second chips.

8. The circuit of claim 5 wherein the first and second chips are attached to each other.

9. The circuit of claim 2 wherein said at least one chip further comprises a first chip having a first area and a second chip having a second area, said first chip being proximate to said cavity bottom, wherein said first chip further comprises a contact pad turned toward said cavity bottom, said substrate further comprising a conductive substrate at said cavity bottom, wherein said first chip contact pad is in electrical connection with said conductive layer, and said second chip has a contact pad turned toward said surface, wherein the electrical connection connects said second chip connection pad to said surface.

10. The circuit of claim 9 wherein the first and second chips are attached to each other.

11. The circuit of claim 9 wherein the cavity further comprises a depth sufficient to receive the first and second chips in said cavity and below the surface.

12. The circuit of claim 9 wherein at least one of the first and second chips comprises more than one chip, said more than one chip being superposed at least partially relative to said other of the first and second chips.

13. An electronic circuit for an active implantable medical device, such as a cardiac pacemaker or defibrillator, comprising:
- at least one chip (12) and at least one other associated electronic component (18) placed on a substrate (10), wherein said at least one chip is a bare chip, not embedded in an encapsulation, having an electrical contact pad on at least one surface, and wherein the chip surface having said contact pad is turned toward the interior, and wherein the substrate comprises a thickness and a cavity (30) having a bottom and a conductive layer opposed to said cavity bottom, wherein the chip is located proximate to the bottom of the substrate cavity, an electrical connection having one end connected to the chip contact pad and the other end extending to the cavity bottom conductive layer; and
- an isolating resin (38) filing the cavity to the surface of the substrate such that the isolating resin covers the chip.

14. The circuit of claim 13, in which at least one of the associated electronic components is placed in superposition above the at least one chip.

15. The circuit of claim 13, further comprising a plurality of supplementary interconnection layers (42,44,46) placed above the chip.

16. The circuit of claim 13, wherein said at least one chip further comprises a first chip having a first area and a second chip having a second area, said first chip being at said cavity bottom, the second chip having at least one contact pad turned toward said surface and said contact pad of the second chip having an electrical connection extending to said surface.

17. The circuit of claim 16, wherein the first and second chips are attached to each other.

18. The circuit of claim 16, wherein the cavity further comprises a depth sufficient to receive the first and second chips in said cavity and below the surface.

19. The circuit of claim 16, wherein the electrical connection to said second chip further comprises an electrical connection thread.

20. The circuit of claim 16, wherein at least one of the first and second chips comprise more than one chip, said more than one chip being superposed at least partially relative to said other of the first and second chips.

* * * * *